(12) United States Patent
Fado et al.

(10) Patent No.: US 6,988,068 B2
(45) Date of Patent: Jan. 17, 2006

(54) COMPENSATING FOR AMBIENT NOISE LEVELS IN TEXT-TO-SPEECH APPLICATIONS

(75) Inventors: Francis Fado, Highland Beach, FL (US); Peter J. Guasti, Coral Springs, FL (US)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 10/396,037

(22) Filed: Mar. 25, 2003

(65) Prior Publication Data

US 2004/0193422 A1 Sep. 30, 2004

(51) Int. Cl.
G10L 19/14 (2006.01)
G10L 13/08 (2006.01)
G10L 21/00 (2006.01)

(52) U.S. Cl. .................. 704/225; 704/260; 704/270
(58) Field of Classification Search ............... 704/225, 704/260, 270
See application file for complete search history.

(56) References Cited

U.S. PATENT DOCUMENTS

| | | | |
|---|---|---|---|
| 4,278,838 A | 7/1981 | Antonov | |
| 4,630,305 A | 12/1986 | Borth et al. | |
| 4,747,143 A | 5/1988 | Kroeger et al. | |
| 4,771,472 A | 9/1988 | Williams, III et al. | |
| 4,797,924 A * | 1/1989 | Schnars et al. | 704/275 |
| 5,329,243 A | 7/1994 | Tay | |
| 5,581,621 A * | 12/1996 | Koyama et al. | 381/103 |
| 5,615,256 A * | 3/1997 | Yamashita | 379/390.01 |
| 5,666,384 A | 9/1997 | Kuban et al. | |
| 5,708,722 A | 1/1998 | Forgues et al. | |
| 5,717,827 A | 2/1998 | Narayan | |
| 5,822,402 A | 10/1998 | Marszalek | |
| 5,937,377 A | 8/1999 | Hardiman et al. | |
| 5,983,183 A | 11/1999 | Tabet et al. | |
| 6,081,780 A | 6/2000 | Lumelsky | |
| 6,141,642 A | 10/2000 | Oh | |
| 6,195,632 B1 | 2/2001 | Pearson | |
| 6,631,179 B1 * | 10/2003 | Sifuentes | 379/88.01 |
| 6,744,882 B1 | 6/2004 | Gupta et al. | |
| 2004/0170284 A1 * | 9/2004 | Janse et al. | 381/66 |

FOREIGN PATENT DOCUMENTS

| | | |
|---|---|---|
| JP | 08208141 | 8/1996 |
| JP | 2001082976 | 3/2001 |

* cited by examiner

*Primary Examiner*—Richemond Dorvil
*Assistant Examiner*—V. Paul Harper
(74) *Attorney, Agent, or Firm*—Akerman Senterfitt

(57) ABSTRACT

A method of automatically adjusting volume of speech generated by a text-to-speech application can include measuring an ambient noise level of an audio environment. A target volume for speech output generated by a text-to-speech application can be calculated based in part upon the ambient noise level. A volume of speech generated by the text-to-speech application can be automatically adjusted responsive to the performed calculation.

19 Claims, 2 Drawing Sheets

COMPENSATING FOR AMBIENT NOISE LEVELS IN TEXT-TO-SPEECH APPLICATIONS

BACKGROUND OF THE INVENTION

1. Technical Field

The present invention relates to the field of voice processing and, more particularly, to text-to-speech applications.

2. Description of the Related Art

Text-to-speech (TTS) applications can be used in a variety of different environments and settings with each environment having an associated level of background noise or ambient noise. The louder the ambient noise within a particular environment, the louder the speech generated by a TTS application needs to be in order for a user to intelligibly comprehend the speech.

Conventional TTS applications provide a user-adjustable volume mechanism for controlling the volume of the output of generated speech. Such a control mechanism can provide a fixed output level for the TTS application. When the ambient noise levels change, however, the user of the TTS application can be forced to either correspondingly manually adjust the volume of the output level or to listen to a signal that is relatively too soft or too loud. When the output level is too soft, the generated speech can be difficult to understand or can be completely unintelligible. When the output level is too loud, the volume level can be uncomfortable for the user and disturbing to inadvertent peripheral listeners within close proximity to the user of the TTS application.

The output level of TTS applications can be excessively problematic in environments with varying ambient noise levels. For example, a TTS application within an automobile, such as a TTS application disposed within a vehicle navigation system, can experience many different ambient noise levels during normal usage. For instance, the appropriate output level for the TTS application can be vastly different when the automobile is at a stop than when the automobile is moving at high speed. Similarly, a comfortable output level can vary substantially when a window of the automobile is up verses down or when surrounding traffic is light verses heavy. As devices that utilize TTS applications proliferate and become more integrated within portable computing devices, the aforementioned difficulties will likely worsen.

SUMMARY OF THE INVENTION

The invention disclosed herein provides a method, a system, and an apparatus for dynamically adjusting the volume of speech generated by text-to-speech (TTS) applications. In particular, just prior to producing an audio output, the invention can sample the ambient noise level existing within an audio environment where the speech is to be played. Calculations can be performed to determine an appropriate output level for the speech based upon the ambient noise level. Modifications can then be made to assure the speech is played at the calculated output level. For example, an amplifier connected to an audio transducer can be modified to achieve the calculated output level. Alternately or conjunctively, the amplitude of the audio signal generated by the TTS application can be adjusted to achieve the calculated output level. Once the appropriate adjustments are made, the audio output signal can be played using the audio transducer.

One aspect of the present invention can include a method of automatically adjusting the volume of speech generated by a TTS application. In the method, the ambient noise level of an audio environment can be measured. In one embodiment, an input used to detect the ambient noise level can be received from a microphone configured to receive speech input for a voice recognition application. A target volume for speech output generated by a TTS application can be calculated, wherein the calculation can be based in part upon the detected ambient noise level. For example, the target volume can be calculated based in part upon a signal-to-noise ratio (SNR) value. In a particular embodiment, the target volume can be limited to a volume range.

Additionally, in one embodiment, a sound pressure level (SPL) for played speech can be detecting and compared to the SPL associated with the target volume. The volume of speech generated by the TTS application can be responsively adjusted. In another embodiment, output characteristics can be identified for at least one audio transducer that plays the speech. These output characteristics can be used when calculating the target volume. In a further embodiment, a plurality of audio transducers can exist. One of these can be selected and the target volume can be adjusted based upon the output characteristics of the selected audio transducer.

After the target volume calculation has been performed, an adjustment can be made to the volume of speech generated by the TTS application. For example, an amplitude of a speech output generated by the TTS application can be adjusted via software configured to modify signals. Alternatively or conjunctively, an amplifier external to the TTS application which is communicatively linked to the audio transducer can be adjusted.

Another aspect of the present invention can include a system for automatically adjusting a volume of speech generated by a TTS application. The system can include a receiving transducer configured to detect an ambient noise level. A TTS application and a calculation engine can also be included. The calculation engine can calculate a target volume based in part upon the ambient noise level within an audio environment. Further, an audio transducer can play speech generated by the TTS application, wherein an output level of the speech is automatically adjusted based upon the target volume.

BRIEF DESCRIPTION OF THE DRAWINGS

There are shown in the drawings embodiments, which are presently preferred, it being understood, however, that the invention is not limited to the precise arrangements and instrumentalities shown.

DETAILED DESCRIPTION OF THE INVENTION

The invention disclosed herein provides a method, a system, and an apparatus for adjusting a volume or output level for speech generated by a text-to-speech (TTS) application. More particularly, the volume can be adjusted relative to the level of ambient noise existing within an audio environment in which the speech is played. The invention includes a receiving transducer that is capable of detecting and measuring the ambient noise level of an audio environment. Before an audio output is transmitted by the TTS application, an ambient noise level can be determined. Thereafter, calculations can be made to determine a target volume based in part upon the measured ambient noise level. The volume for the speech generated by the TTS application can then be adjusted responsive to this calculated value.

Figure 1:
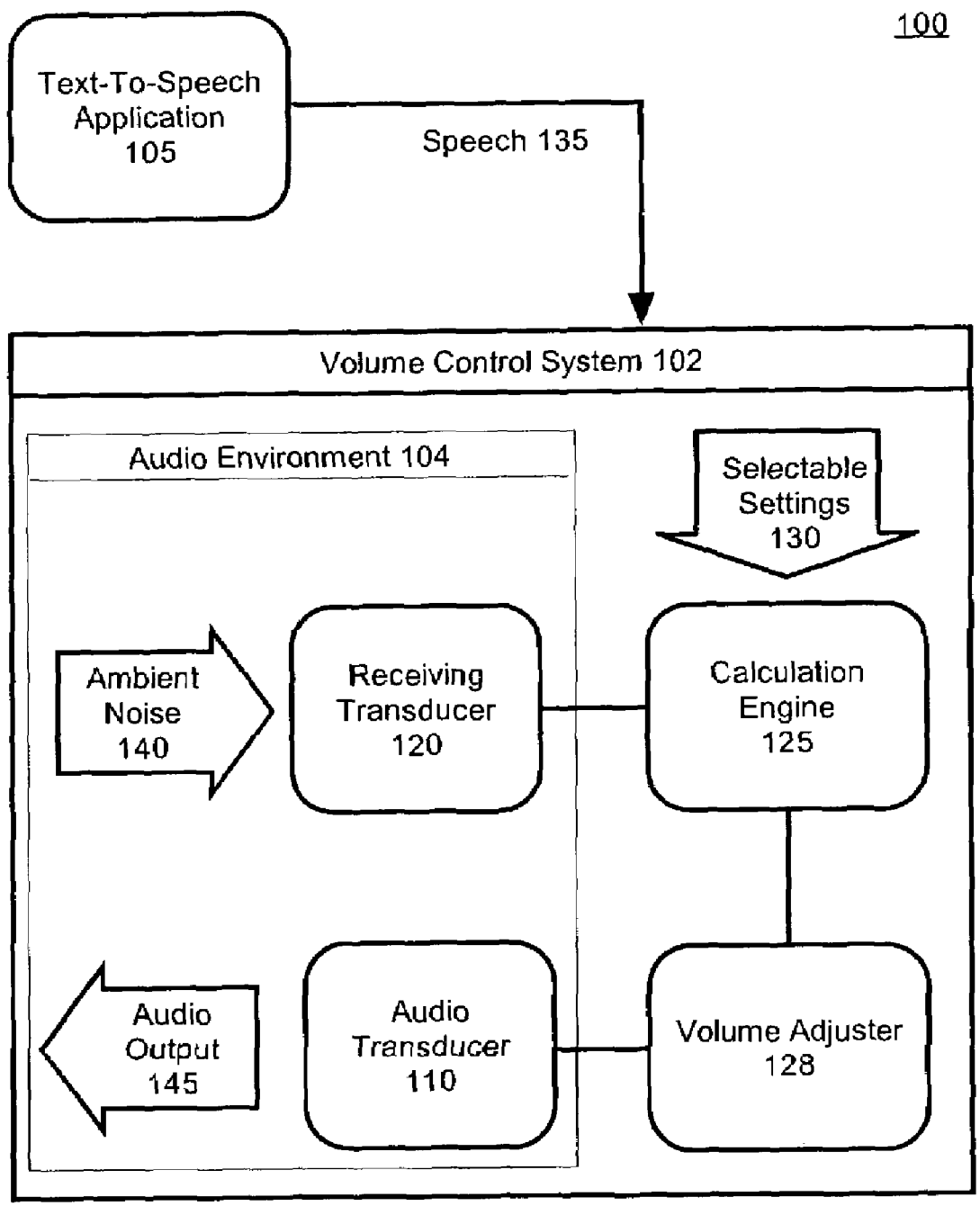
FIG. 1 is a schematic diagram illustrating a system that can adjust the volume of speech generated by a TTS application based upon ambient noise levels according to the inventive arrangements disclosed herein.

FIG. 1 is a schematic diagram illustrating a system 100 that can adjust the volume of speech generated by a TTS application based upon ambient noise levels according to the inventive arrangements disclosed herein. The system 100 can include an audio transducer 110, a receiving transducer 120, a volume adjuster 128, and a calculation engine 125. The audio transducer 110 can be any device capable of converting an electrical signal, such as a speech input 135, into sonic output, such as speech output 145. For example, the audio transducer 110 can be a speaker or a system of speakers.

The receiving transducer 120 can detect and measure ambient noise 140. The receiving transducer 120 can include a single element or can include multiple elements forming an input array. For example, receiving transducer 120 can include a microphone for receiving an input containing ambient noise 140 and associated software for measuring the ambient noise 140. In one embodiment, the receiving transducer 120 can be used by the TTS application 105 to receive speech as well as to detect ambient noise 140 for a volume control system 102. The receiving transducer 120 need not be a microphone, but can be any device capable of detecting and measuring ambient noise 140. For example, the receiving transducer 120 can include a sound pressure level (SPL) meter, a standard volume indicator (VU meter), a peak program meter (PPM), and/or any other such audio level or audio volume measuring device used either singularly or in combination with other such devices.

The calculation engine 125 can determine a desired audio output level based in part upon the ambient noise level. A signal-to-noise ratio (SNR), which is a measure of signal strength relative to ambient noise, can be used by the calculation engine 125 to determine a target output level. Hence, for any given SNR value, a speech output level can be computed.

It should be noted, however, that not every calculated speech output level is technically practical or desirable to produce. For example, every audio transducer 110 has an associated range of SPL levels that the audio transducer 110 is capable of producing. The calculated audio output value is therefore constrained to this range. To further complicate matters, the audio transducer 110 as well as associated hardware components, such as an amplifier, can produce noise and distortions when generating the speech output 145 from the speech input 135. The level of noise and distortions produced by the audio transducer 110 and associated components can vary depending on the audio output level and design details of the hardware. Since these output characteristics are mathematically definable, the calculation engine 125 can modify an initially calculated output level value to compensate for the output characteristics of the audio hardware. Similarly, the receiving transducer 120 can contain mathematically definable characteristics for which the calculation engine 125 can compensate.

Other limitations upon calculated output levels can result from physical characteristics, such as hearing ability, and preferences of a listener. For example, the average threshold of human hearing is 0 dB, a whisper can be 20 dB, and normal speech can be 70 dB. Accordingly, users of system 100 can desire audio output levels to be within a volume range so that the user can comfortably listen to the audio output. Consequently, the output level calculated by the calculation engine 125 can represent a compromise among a multitude of desirable factors or user preferences, such as SNR and volume.

In one embodiment, the calculation engine 125 will produce an output level which represents a desired volume within a predetermined system. For example, the predefined system can include a software volume adjustment programs. In another embodiment, the output level of the calculation engine 125 can represent an SPL actually produced by the audio transducer 110. In such an embodiment, the receiving transducer 120 can sample the speech output 145 causing the calculation engine 125 to adjust parameters until the desired SPL for the calculated output level is produced.

Selectable settings 130 can be provided to the calculation engine 125 to adjust the behavior of the calculation engine 125. For example, a user of system 100 can enter output settings 130 for establishing a minimum or maximum volume range. Furthermore, specifications for one or more audio transducers 110 can be entered as output settings 130. In one embodiment, output settings 130 can be entered manually by users. Alternatively or conjunctively, output settings 130 can be automatically provided to the calculation engine 125. For example, plug-and-play computer peripherals can transmit peripheral specifications to the calculation engine 125 disposed within a computing device upon being first connected to the computing device.

The volume adjustor 128 can alter the volume of the audio output 145 based upon an output level calculated by the calculation engine 125. In one embodiment, the volume adjuster 128 can be a software application. For example, the volume adjuster 128 can be a software routine capable of adjusting the audio output (i.e. via sound card drivers) of a computing device receiving the speech 135 from the TTS application 105. Additionally, the volume adjustor 128 can include hardware, such as an amplifier. For example, the audio transducer 110 can be connected to an amplifier which can be automatically adjusted by the volume adjuster 128. Further, the volume adjuster 128 can adjust the volume of a variety of signals including signals which comprise ambient noise 140.

In one such instance, the system 100 can be implemented within an automobile audio system. The speech input 135 can represent speech generated by a TTS application 105 associated with a vehicle navigation system. A principle component of the ambient noise 140 can be the stereo system of the vehicle. In such a system, the volume adjustor 128 can lower the stereo volume in addition to raising the volume of the speech input 135. Similarly, in systems with multiple audio tracks, the volume adjustor 128 can increase the output level of tracks associated with the speech input 135 while decreasing the output level of other tracks which are components of the ambient noise 140.

In operation, the TTS application 105 can generate an audio output signal 135, such as speech, that triggers the system to sample for ambient noise 140. The receiving transducer 120 can receive and measure the level of the ambient noise 140 and convey this ambient noise measurement to the calculation engine 125. The calculation engine 125 can use internal algorithms and heuristics, internal parameters, selectable settings 130, and the ambient noise measurement from the receiving transducer 120, to calculate an audio output level.

The volume adjuster 128 can responsively alter the speech output 145 as well as other controllable audio signals within the audio environment 104. For instance, the volume adjustor 128 can lower components forming ambient noise 140. For purposes of system 100, any audio signal not comprising speech output 145 is a component of ambient noise 140. The audio transducer 110 can generate the speech output 145 after the volume adjustor 128 has triggered appropriate adjustments.

It should be noted that the system 100 can contain multiple audio transducers 110 used together or separately. For example, the speech output 145 can commonly be constructed from multiple audio transducers 110, such as two front channel speakers, a center speaker, two rear speakers, and a subwoofer. Each speaker can have different output characteristics. Accordingly, the calculation engine 125 can separately calculate multiple output levels for the multiple audio transducers 110 within a system. These calculations need not be performed in an isolated fashion, but the overall audio output from the sum of the audio transducers 110 within a specific system can be considered by the calculation engine 125.

In another embodiment, a device containing the calculation engine 125 can utilize different transducers 110 with substantially different output characteristics. For example, a personal data assistant utilizing the invention can contain a small internal speaker and can alternatively be connected to a more robust audio system. Acoustic limitations and preferences for the personal data assistant can largely depend upon which speaker system is being used. Accordingly, different selectable settings 130 for different potential audio transducer 110 configurations can be utilized by the calculation engine 125.

Any of a variety of different mechanisms can be utilized to calculate the audio output levels for detected ambient noise levels. Accordingly, the invention is not limited by any particular technique used to calculate audio output levels and any technique used. For example, a lookup table algorithm and/or fuzzy logic can be used within the calculation engine 125 to determine output levels and to improve processing time.

The component arrangement depicted within FIG. 1 is one possible arrangement for the described components and should not be taken as the only possible arrangement of the invention. For example, in one embodiment, the volume control system 102 can be integrated with the TTS application 105 as opposed to being separately implemented as depicted in FIG. 1. Since the ambient noise 140 and speech output 145 should both reside within the same perceptual environment, the receiving transducer 120 and the audio transducer 110 are preferably disposed within the same audio environment 104. No other geographic restrictions exist within the system 100 so long as the components depicted are communicatively linked to one another. For example, the calculation engine 125 can be a distributed application which accesses a variety of network dispersed data stores, processors, and/or applications.

Figure 2:
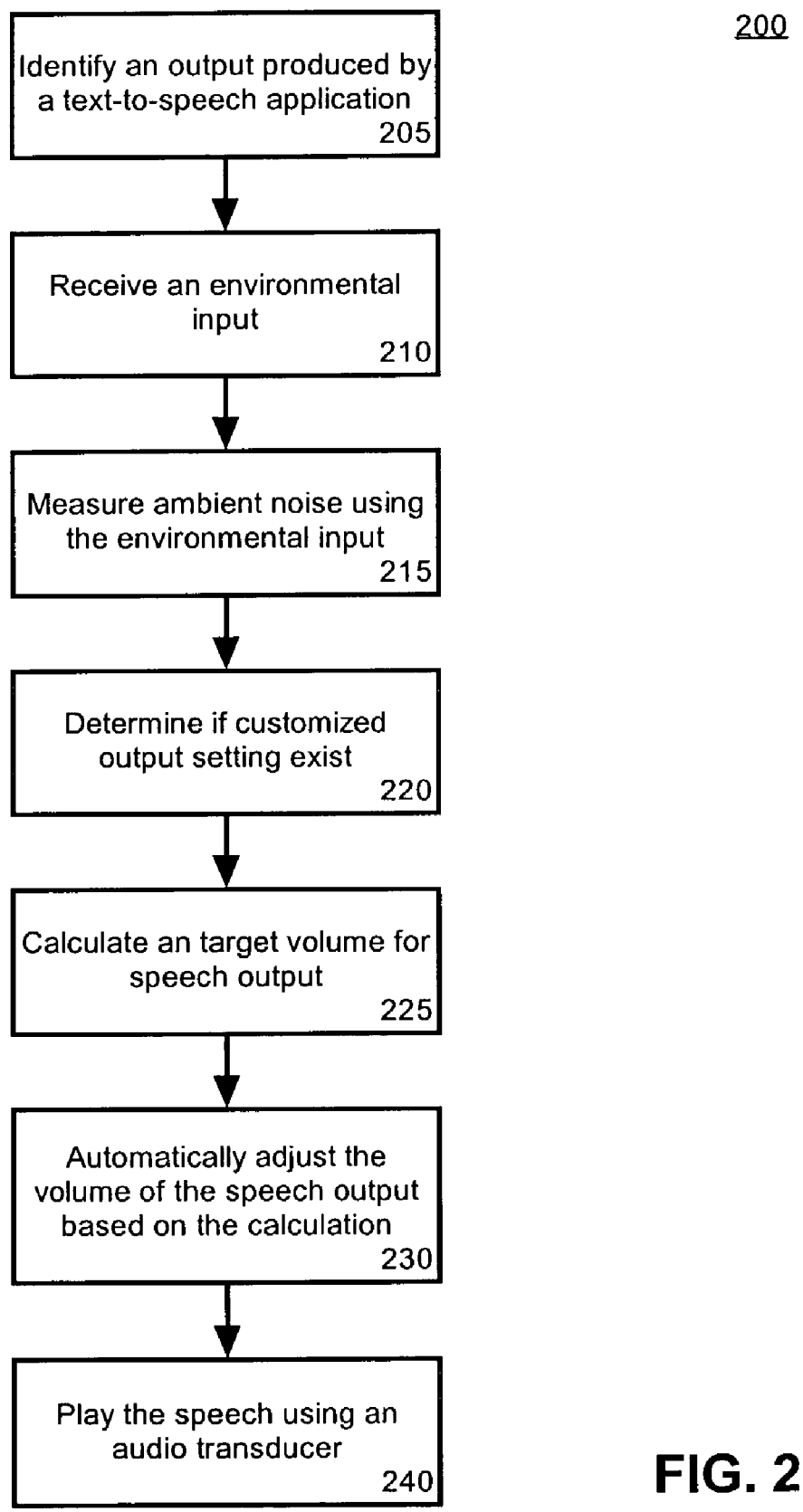
FIG. 2 is a flow chart illustrating a method for compensating for ambient noise using the system of FIG. 1.

FIG. 2 is a flow chart illustrating a method 200 for compensating for ambient noise using the system of FIG. 1. The method 200 can be performed in the context of a TTS generation system including at least one audio transducer for playing generated speech and at least one ambient noise detection device. The method can begin in step 205, where an output signal (speech output) produced by the TTS application can be identified. Alternatively stated, the method 200 can begin when speech has been synthetically generated and is about to be audibly played. In step 210, before the speech output is played, an input can be received from the audio environment by a receiving transducer that detects an ambient noise level. The audio environment from which the ambient noise level sample is taken should be the same perceptual environment in which the speech output is to be played. Such an ambient noise level input can be an audio sample taken with a microphone, or a measurement recorded by an SPL detection device, such as an SPL meter. In step 215, a measurement of the ambient noise can be determined using the ambient noise level input.

In step 220, a determination can be made as to whether any customized output settings exist. In one embodiment, output settings, such as a preferred volume and/or SNR, can be set by a user of the method 220. In another embodiment, hardware output devices can impose limitations, such as maximum and minimum volume range. Notably, the characteristics of the hardware utilized within method 200 can be quantified so that these characteristics can be considered when performing adjustment calculations. In step 225, an audio output level can be calculated. Such a calculation can take any customized input and/or output settings, if any, into account.

In step 230, the volume of the speech output can be adjusted responsive to the calculated output level. For example, the amplitude of a generated audio signal can be adjusted and/or the amplifier connected to the audio transducer can be adjusted. This adjustment need not be exact and can be modified conform to capabilities and features of an audio system including the audio transducer. For example, if a calculated volume level exceeds the maximum volume of an audio system, the volume of the audio system can be adjusted to this maximum level. In step 235, the speech input produced by the TTS application can be conveyed to the audio transducer. In step 240, the audio transducer can produce a sonic output containing the synthetically produced speech at the established audio output level.

It should be noted that, as used herein, an audio environment can include the ambient noise detection devices as well as the audio transducer that plays the speech output. The other system components can be widely distributed and need not be contained within the audio environment. For example, the text to speech application can be distributed across a computer network and distributed to multiple client computers, each located within individual audio environments.

In another example, a user can subscribe to a Web service that provides TTS processing in accordance with this invention. In such an example, the ambient noise level can be detected within the user's environment and submitted across the Internet to the provider of the Web service. The provider can perform the output level calculations, and generate speech at an output level appropriate for the calculations. This speech audio output can be submitted across the Internet to the user where it can be played by an audio transducer.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system having suitable audio circuitry and components, such that it carries out the methods described herein. The present invention can further be implemented in a modular component system, whether implemented diversely across many components or embedded within a single component.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of automatically adjusting volume of speech generated by a text-to-speech application comprising the steps of:
   receiving an audio output signal from a text-to-speech application;
   responsive to receiving the signal, a volume control system measuring an ambient noise level of an audio environment, wherein the volume control system is separately implemented from the text-to-speech application;
   the volume control system calculating a target volume for speech output generated by a text-to-speech application based in part upon said ambient noise level; and,
   the volume control system automatically adjusting volume of speech generated by said text-to-speech application responsive to said calculating step.

2. The method of claim 1, wherein said adjusting step further comprising the step of:
   adjusting audio output of a computing device receiving the audio output signal from the text-to-speech application using sound card drivers associated with the computing device.

3. The method of claim 1, wherein said adjusting step adjusts volume based in part upon a hearing ability of a listener.

4. The method of claim 1, further comprising the steps of:
   detecting a sound pressure level for played speech;
   comparing said sound pressure level with a sound pressure level associated with said target volume; and,
   responsively adjusting said volume of speech generated by said text-to-speech application.

5. The method of claim 1, further comprising the step of;
   limiting said target volume to a volume range.

6. The method of claim 1, wherein said calculating step further comprising the step of:
   calculating said target volume based in part upon a signal-to-noise ratio value; and
   wherein said method further comprises the step of automatically adjusting at least one controllable component that generates ambient noise to lower the ambient noise.

7. The method of claim 1, wherein said measuring step further comprising the step of:
   receiving an ambient noise input from a microphone configured to receive a speech input for a voice recognition application, wherein the ambient noise input is used in the measuring step to measure the ambient noise level.

8. The method of claim 1, further comprising the step of:
   identifying output characteristics of at least one audio transducer that plays speech, wherein said calculating step utilizes said output characteristics, wherein the at least one audio transducer includes a plug-and-play computer peripheral, and wherein the output characteristics are automatically provided to the volume control system.

9. The method of claim 8, wherein said at least one audio transducer comprises a plurality of audio transducers, said method fitter comprising the steps of:
   selecting one of said plurality of audio transducers; and
   adjusting said target volume based upon said output characteristics of said selected audio transducer.

10. A system for automatically adjusting a volume of speech generated by a text-to-speech application comprising:
    a receiving transducer configured to detect an ambient noise level;
    a text-to-speech application;
    a calculation engine configured to calculate a target volume based in part upon said ambient noise level; and,
    an audio transducer configured to play speech generated by said text-to-speech application, wherein an output level of said speech is automatically adjusted based upon said target volume, wherein said automatic adjustments occur responsive to a volume control system receiving an audio output signal from the text-to-speech application wherein the volume control system includes said calculation engine, and wherein said volume control system is separately implemented from the text-to-speech application.

11. A machine-readable storage having stored thereon, a computer program having a plurality of code sections, said code sections executable by a machine for causing the machine to perform the steps of:
    receiving an audio output signal from a text-to-speech application;
    responsive to receiving the signal, a volume the control system measuring an ambient noise level of an audio environment, wherein the volume control system is separately implemented from the text-to-speech application;
    the volume control system calculating a target volume for speech output generated by a text-to-speech application based in part upon said ambient noise level; and,
    the volume control system automatically adjusting volume of speech generated by said text-to-speech application responsive to said calculating step.

12. The machine-readable storage of claim 11, wherein said adjusting step further comprising the step of:
    adjusting audio output of a computing device receiving the audio output signal from the text-to-speech application using sound card drivers associated with the computing device.

13. The machine-readable storage of claim 11, wherein said adjusting step adjusts volume based in part upon a hearing ability of a listener.

14. The machine-readable storage of claim 11, further comprising the steps of:
    detecting a sound pressure level for played speech;
    comparing said sound pressure level with a sound pressure level associated with said target volume; and,
    responsively adjusting said volume of speech generated by said text-to-speech application.

15. The machine-readable storage of claim 11, further comprising the step of:
   limiting said target volume to a volume range.

16. The machine-readable storage of claim 11, wherein said calculating step further comprising the step of:
   calculating said target volume based in part upon a signal-to-noise ratio value; and
wherein said method further comprises the step of automatically adjusting at least one controllable component that generates ambient noise to lower the ambient noise.

17. The machine-readable storage of claim 11, wherein said measuring step further comprising the step of:
   receiving an ambient noise input from a microphone configured to receive a speech input for a voice recognition application, wherein the ambient noise input is used in the measuring step to measure the ambient noise level.

18. The machine-readable storage of claim 11, further comprising the step of:
   identifying output characteristics of at least one audio transducer that plays speech, wherein said calculating step utilizes said output characteristics, wherein the at least one audio transducer includes a plug-and-play computer peripheral, and wherein the output characteristics are automatically provided to the volume control system.

19. The machine-readable storage of claim 18, wherein said at least one audio transducer comprises a plurality of audio transducers, said method further comprising the steps of:
   selecting one of said plurality of audio transducers; and
   adjusting said target volume based upon said output characteristics of the selected audio transducer.

* * * * *